(12) United States Patent
Seki et al.

(10) Patent No.: US 6,657,467 B2
(45) Date of Patent: Dec. 2, 2003

(54) DELAY CONTROL CIRCUIT WITH INTERNAL POWER SUPPLY VOLTAGE CONTROL

(75) Inventors: Takahiro Seki, Kanagawa (JP); Masakatsu Nakai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/216,318

(22) Filed: Aug. 12, 2002

(65) Prior Publication Data

US 2003/0030483 A1 Feb. 13, 2003

(30) Foreign Application Priority Data

Aug. 10, 2001 (JP) ...................................... P2001-243801

(51) Int. Cl.[7] ................................................ H03L 7/06
(52) U.S. Cl. .......................... 327/158; 327/149; 327/27
(58) Field of Search ................................. 327/147, 148, 327/149, 156, 157, 158, 277

(56) References Cited

U.S. PATENT DOCUMENTS

| | | | | |
|---|---|---|---|---|
| 5,054,038 A | * | 10/1991 | Hedberg | ...................... 327/261 |
| 5,451,894 A | * | 9/1995 | Guo | ............................. 327/241 |
| 5,550,514 A | * | 8/1996 | Liedberg | ..................... 327/158 |
| 5,939,912 A | * | 8/1999 | Rehm | .......................... 327/158 |
| 6,486,716 B1 | * | 11/2002 | Minami et al. | ............. 327/152 |

* cited by examiner

*Primary Examiner*—Terry D. Cunningham
(74) *Attorney, Agent, or Firm*—Rader, Fishman & Grauer PLLC; Ronald P. Kananen

(57) ABSTRACT

The present invention provides a semiconductor device a comprising: a delayed-signal-generating circuit for delaying a reference pulse signal by a delay time caused by a delay component on a critical path of a target circuit by a selector included in the delayed signal generating circuit and, thereby, generating a delayed pulse signal; a detection-signal-generating circuit, having the same delay component as the selector, for generating a detection pulse signal delayed in phase by one cycle of a clock signal Ck with respect to the reference pulse signal; a delay-difference-detecting circuit for detecting a phase difference between the delayed pulse signal and the detection pulse signal; and a control circuit for adjusting the magnitude of a power-supply voltage VDD supplied to the target circuit according to the-phase difference detected by the delay-difference-detecting circuit.

8 Claims, 13 Drawing Sheets

F I G. 2
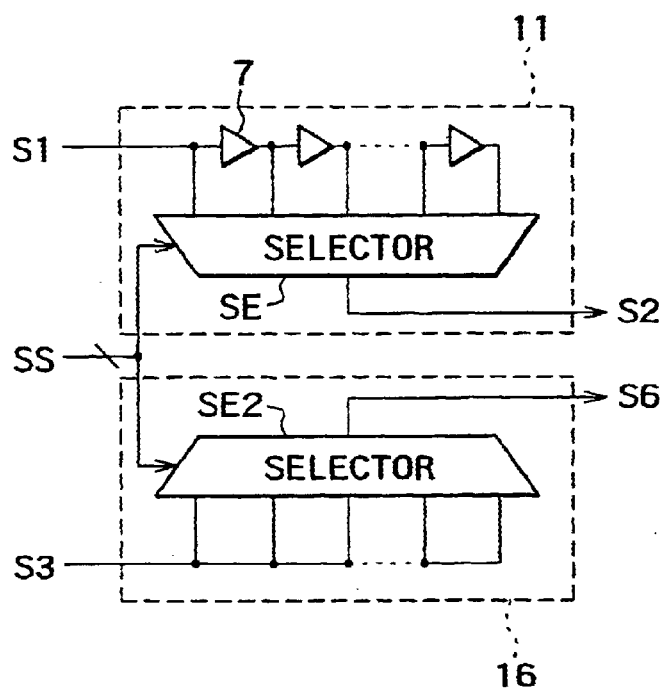
F I G. 3
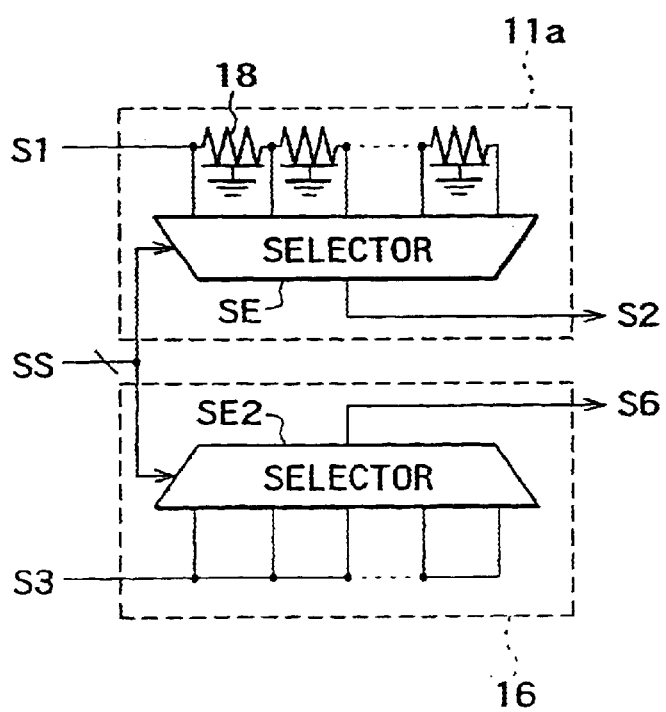

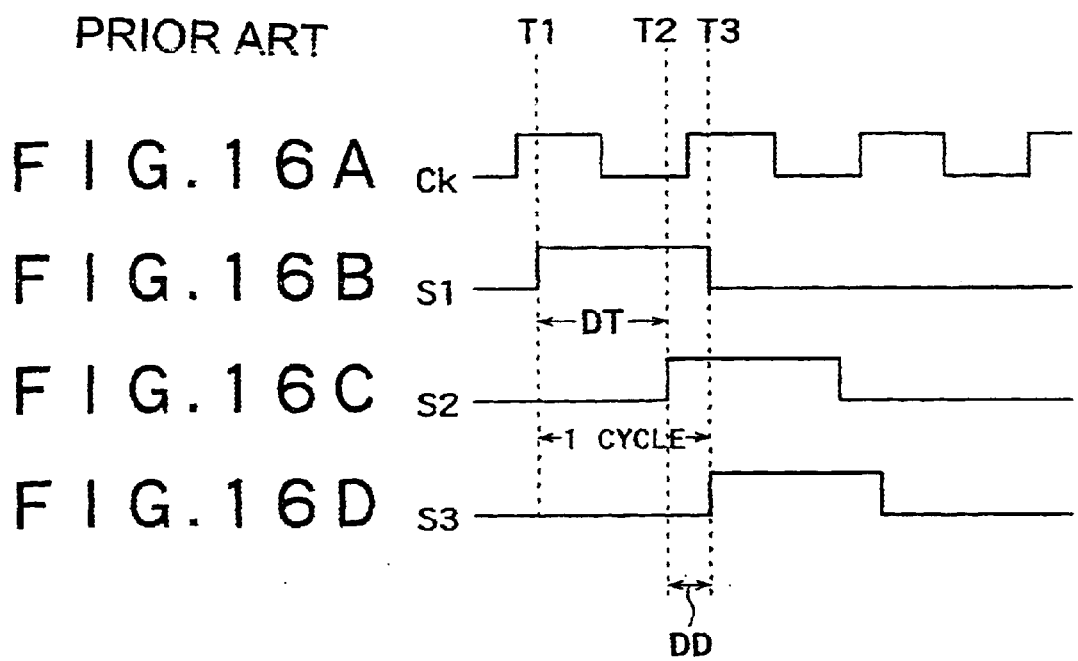
FIG. 16A Ck PRIOR ART
FIG. 16B S1
FIG. 16C S2
FIG. 16D S3
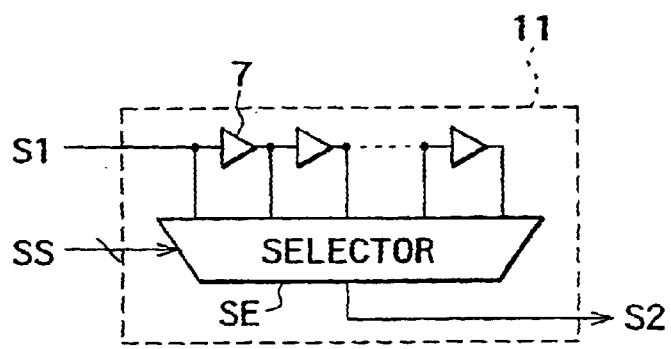
FIG. 17 PRIOR ART

DELAY CONTROL CIRCUIT WITH INTERNAL POWER SUPPLY VOLTAGE CONTROL

BACKGROUND OF THE INVENTION

The present invention relates to a semiconductor device that can control power supply voltage supplied to an internal circuit included therein.

Recent developments of semiconductor integrated circuits use techniques of lowering power supply voltage to reduce power. This is because a dynamic component of power consumption of a semiconductor integrated circuit is in proportion to the square of the power supply voltage. The techniques of lowering the power supply voltage are therefore most effective techniques for reducing the power to the semiconductor integrated circuit.

From such a point of view, a method has recently been proposed which supplies a minimum voltage at all times by controlling the power supply voltage adaptively to operating frequency of the semiconductor integrated circuit, process variations or the like.

FIG. 15 is a block diagram showing a configuration of a conventional semiconductor device. As shown in FIG. 15, the conventional semiconductor device includes: a register 8, a pulse generating circuit 10, a delayed signal generating circuit 11, a delay difference detecting circuit 12, a control circuit 13, a power supply circuit 14, and a target circuit 15.

The pulse generating circuit 10 and the target circuit 15 are supplied with a clock signal Ck. The delayed signal generating circuit 11 is connected to the register 8 and the pulse generating circuit 10. The delay difference detecting circuit 12 is connected to the pulse generating circuit 10 and the delayed signal generating circuit 11. The control circuit 13 is connected to the delay difference detecting circuit 12. The power supply circuit 14 is connected to the control circuit 13. The power supply circuit 14 supplies a power supply voltage $V_{DD}$ to the delayed signal generating circuit 11 and the target circuit 15. Incidentally, the power supply circuit 14 may supply the power supply voltage $V_{DD}$ not only to the target circuit 15 and the delayed signal generating circuit 11 but also to the pulse generating circuit 10, the delay difference detecting circuit 12, and the control circuit 13.

In the semiconductor device having a configuration as described above, the pulse generating circuit 10 is supplied with the clock signal Ck to generate a reference pulse signal S1 and generate a detection pulse signal S3 for detecting an amount of delay of the generated reference signal S1. As shown in FIGS. 16A to 16D, the detection pulse signal S3 is delayed by for example a period from a time T1 to a time T3, that is, one cycle of the clock signal Ck with respect to the reference pulse signal S1.

The reference pulse signal S1 is supplied to the delayed signal generating circuit 11 to be delayed by a delay time DT from the time T1 to a time T2 by a delay component equal to a delay component possessed by the target circuit 15, whereby a delayed pulse signal S2 as shown in FIG. 16C is generated.

The delay difference detecting circuit 12 compares a phase of the thus generated delayed pulse signal S2 with that of the detection pulse signal S3 supplied from the pulse generating circuit 10, to thereby detect a delay difference DD, a period from the time T2 to the time T3 shown in FIG. 16D, and generate a signal S4 corresponding to the delay difference. Then, in response to the signal S4 being supplied to the control circuit 13, the control circuit 13 supplies the power supply circuit 14 with a control signal S5 for reducing the delay difference to zero. Thus, the power supply circuit 14 lowers the power supply voltage $V_{DD}$ until the delay difference DD is reduced to zero, thereby reducing power consumption of the target circuit 15.

FIG. 17 is a diagram showing a configuration of the delayed signal generating circuit 11 shown in FIG. 15. As shown in FIG. 17, the delayed signal generating circuit 11 includes a plurality of buffers 7 connected in series with each other in multiple stages and a selector SE. The selector SE selectively connects either one of nodes between the buffers 7 with an output node in response to a setting signal SS supplied from the register 8, thereby adjusting the number of buffers 7 through which the reference pulse signal S1 supplied to the delayed signal generating circuit 11 propagates. Thus, the same delay characteristic as that of the target circuit 15 is realized. Incidentally, the setting signal SS is stored in advance in the register 8.

However, since the delayed signal generating circuit 11 realizes the desired delay characteristic by the selector SE, as described above, the reference pulse signal 51 is delayed also by the selector SE itself and the like, thus deteriorating accuracy of the delay difference detected by the delay difference detecting circuit 12.

More specifically, an undesired delay component included in a transmission path of the reference pulse signal S1 makes it impossible to control the power supply voltage $V_{DD}$ with high accuracy.

SUMMARY OF THE INVENTION

The present invention has been made to solve such problems, and it is accordingly an object of the present invention to provide a semiconductor device capable of controlling the power supply voltage supplied to the internal circuit with high accuracy by realizing the delay characteristic equal to the delay characteristic of a critical path of the internal circuit with high accuracy.

The object of the present invention is achieved by providing a semiconductor device comprising: delay means for delaying an input signal by a delay time caused by a delay component on a critical path of an internal circuit by delay amount selecting means included in the delay means, and thereby generating a delayed signal; reference signal generating means, having a delay component identical with a delay component of the delay amount selecting means, for generating a reference signal delayed in phase by one cycle of an internal operating clock signal in comparison with the input signal; phase difference detecting means for detecting a phase difference between the reference signal and the delayed signal; and power supply voltage adjusting means for adjusting magnitude of a power supply voltage supplied to the internal circuit according to the phase difference detected by the phase difference detecting means.

The "critical path" mentioned above refers to a transmission path of a maximum signal propagation delay time among signal transmission paths possessed by the internal circuit.

With such means, a delay time caused by the delay amount selecting means itself included in the delay means is cancelled out by the reference signal generating means. Therefore, the delay characteristic possessed by the critical path of the internal circuit can be reproduced with high accuracy. It is thus possible to improve accuracy in adjustment of the power supply voltage by the power supply voltage adjusting means.

The delay means can delay the input signal by any one of a gate, wiring, capacitor, and a MOS transistor, for example.

Moreover, when the wiring is formed by connecting a plurality of wiring layers forming the internal circuit according to a component ratio of the plurality of wiring layers, the delay characteristic possessed by the critical path of the internal circuit can be reproduced with higher accuracy.

In addition, by making a difference between the delay components of the delay means and the reference signal generating means the delay component of an element forming the critical path of the internal circuit, input characteristics such as input capacitance of the delay means and the reference signal generating means can be made substantially the same. It is thus possible to produce the delay characteristic desired with higher accuracy.

Furthermore, the object of the present invention is achieved by providing a semiconductor device comprising: first delay means for delaying an input signal by a first delay time caused by a first delay component on a critical path of an internal circuit by the first delay component with first delay amount selecting means included in the first delay means, and thereby generating a first delayed signal; second delay means for delaying the first delayed signal by a second delay time caused by a second delay component on the critical path of the internal circuit by the second delay component with second delay amount selecting means included in the second delay means, and thereby generating a second delayed signal; reference signal generating means, having a delay component identical with delay components of the first delay amount selecting means and the second delay amount selecting means, for generating a reference signal delayed in phase by one cycle of an internal operating clock signal in comparison with the input signal; phase difference detecting means for detecting a phase difference between the reference signal and the second delayed signal; and power supply voltage adjusting means for adjusting magnitude of a power supply voltage supplied to the internal circuit according to the phase difference detected by the phase difference detecting adjust the different delay components in parallel by means.

With such means, it is possible to arbitrarily adjust the different delay components in parallel by switching the first delay amount selecting means and the second delay amount selecting means. Therefore, accuracy and versatility in adjusting the power supply voltage to the internal circuit can be increased.

Supposing that the first delay component is a delay component of a wiring having a first length and the second delay component is a delay component of a wiring having a second length longer than the first length, it is possible to first roughly adjust the delay time of the input signal by switching the second delay amount selecting means and then finely adjust the delay time by switching the first delay amount selecting means. Therefore, the delay time of the input signal can be adjusted hierarchically with high accuracy.

Furthermore, when a plurality of delay means having different delay components as described above are connected in series with each other, more complex delay characteristics of the internal circuit can be reproduced, so that accuracy and versatility in adjusting the power supply voltage to the internal circuit can be further increased.

BRIEF DESCRIPTION OF THE DRAWINGS

FIG. 2 is a diagram showing a first example of configuration of a delayed signal generating circuit and a detection signal generating circuit shown in FIG. 1;

FIG. 3 is a diagram showing a second example of configuration of the delayed signal generating circuit and the detection signal generating circuit shown in FIG. 1;

FIGS. 16A, 16B, 16C, and 16D are waveform diagrams of assistance in explaining operation of the semiconductor device shown in FIG. 15; and FIG. 17 is a diagram showing a configuration of a delayed signal generating circuit shown in FIG. 15.

DETAILED DESCRIPTION OF PREFERRED EMBODIMENTS

Figure 1:
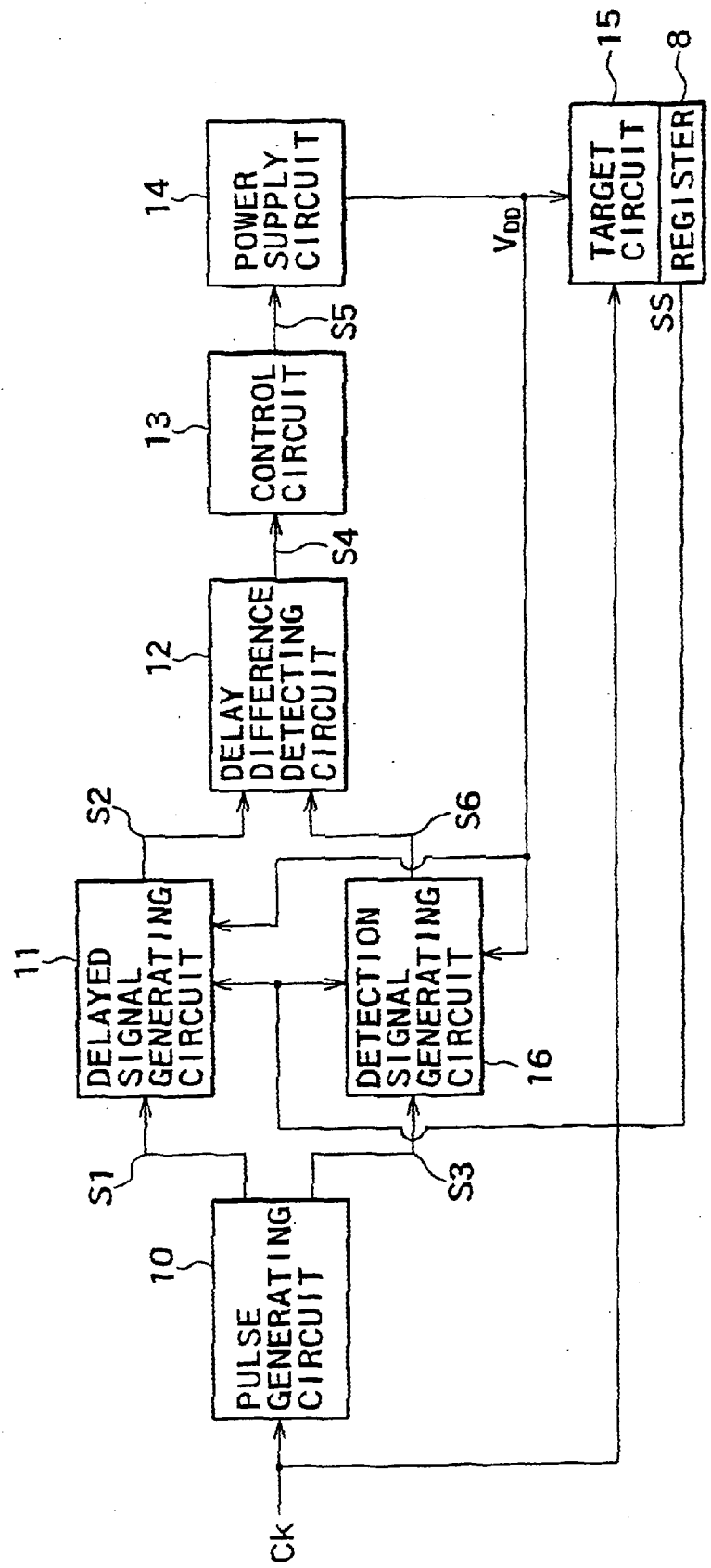
FIG. 1 is a block diagram showing a configuration of a semiconductor device according to a first embodiment of the present invention.

Preferred embodiments of the present invention will hereinafter be described in detail with reference to the drawings. In the drawings, the same reference numerals indicate the same or corresponding parts.

First Embodiment

FIG. 1 is a block diagram showing a configuration of a semiconductor device according to a first embodiment of the present invention. As shown in FIG. 1, the semiconductor device according to the first embodiment includes: a register 8, a pulse generating circuit 10, a delayed signal generating circuit 11, a delay difference detecting circuit 12, a control circuit 13, a power supply circuit 14, a target circuit 15, and a detection signal generating circuit 16.

The pulse generating circuit 10 and the target circuit 15 are supplied with a clock signal Ck. The delayed signal generating circuit 11 and the detection signal generating circuit 16 are connected to the register 8 and the pulse generating circuit 10. The delay difference detecting circuit 12 is connected to the delayed signal generating circuit 11 and the detection signal generating circuit 16. The control circuit 13 is connected to the delay difference detecting circuit 12. The power supply circuit 14 is connected to the control circuit 13. The power supply circuit 14 supplies a power supply voltage $V_{DD}$ to the delayed signal generating circuit 11, the detection signal generating circuit 16, and the target circuit 15. Incidentally, the power supply circuit 14 may also supply the power supply voltage $V_{DD}$ to the pulse generating circuit 10, the delay difference detecting circuit 12, and the control circuit 13.

In the semiconductor device having a configuration as described above, the pulse generating circuit 10 is supplied with the clock signal Ck to generate a reference pulse signal S1 and generate a detection pulse signal S3 for detecting an amount of delay of the generated reference signal S1. The detection pulse signal S3 is delayed by one cycle of the clock signal Ck with respect to the reference pulse signal S1.

The reference pulse signal S1 is supplied to the delayed signal generating circuit 11 to be delayed by a delay component equal to a delay component possessed by a critical path of the target circuit 15, whereby a delayed pulse signal S2 is generated. The "critical path" refers to a transmission path of a maximum signal propagation delay time among signal transmission paths possessed by the target circuit 15.

In the meantime, the detection pulse signal S3 is supplied to the detection signal generating circuit 16 to be delayed by a predetermined time, whereby a detection pulse signal S6 is generated.

The delay difference detecting circuit 12 compares a phase of the thus generated delayed pulse signal S2 with that of the detection pulse signal S6 supplied from the detection signal generating circuit 16, to thereby detect a delay difference, and generate a signal S4 corresponding to the delay difference. Then, in response to the signal S4 being supplied to the control circuit 13, the control circuit 13 supplies the power supply circuit 14 with a control signal S5 for reducing the delay difference to zero. Thus, the power supply circuit 14 lowers the power supply voltage $V_{DD}$ until the delay difference is reduced to zero, thereby reducing power consumption of the target circuit 15.

FIG. 2 is a diagram showing an example of configuration of the delayed signal generating circuit 11 and the detection signal generating circuit 16 shown in FIG. 1. As shown in FIG. 2, the delayed signal generating circuit 11 includes a plurality of buffers 7 connected in series with each other in multiple stages and a selector SE, while the detection signal generating circuit 16 includes a selector SE2.

The selector SE selectively connects either one of nodes between the buffers 7 with an output node in response to a setting signal SS supplied from the register 8, thereby adjusting the number of buffers 7 through which the reference pulse signal S1 supplied to the delayed signal generating circuit 11 propagates. Thus, the same delay characteristic as that of the target circuit 15 is realized.

The selector SE2 selects a transmission path in the selector SE2 in response to the setting signal SS supplied from the register 8. Incidentally, while the setting signal SS is stored in advance in the register 8, the setting signal SS may be externally supplied to the selector SE and the selector SE2 via an external pin (not shown).

Since the detection signal generating circuit 16 includes the selector SE2, the detection signal generating circuit 16 has the same delay component as an undesired delay component included in a signal transmission path within the delayed signal generating circuit 11, that is, a delay component formed by the selector SE.

Hence, in the semiconductor device shown in FIG. 1, the detection pulse signal 53 is delayed by the detection signal generating circuit 16 by a time equal to a time by which the reference pulse signal S1 is delayed by the selector SE included in the delayed signal generating circuit 11, whereby the delay time is cancelled out. Thus, the semiconductor device can accurately delay the reference pulse signal S1 with respect to the detection pulse signal S3 by a delay component of the buffers 7.

As described above, with the semiconductor device according to the first embodiment of the present invention, the detection pulse signal S3 is delayed by an amount corresponding to the undesired delay included in the delayed pulse signal S2, and an amount of delay of the delayed pulse signal S2 with respect to the detection pulse signal S3 is caused only by a desired delay component. Thus, in response to critical path characteristics of the target circuit 15, the power supply voltage can be reduced to a limit within a permissible range with high accuracy.

It is to be noted that while the delayed signal generating circuit 11 shown in FIG. 2 uses the buffers 7 as delay elements, a delayed signal generating circuit 11a may be formed using wiring delay elements 18 in place of the buffers 7, as shown in FIG. 3, or a delayed signal generating circuit may be formed using other delay elements.

Second Embodiment

Figure 4:
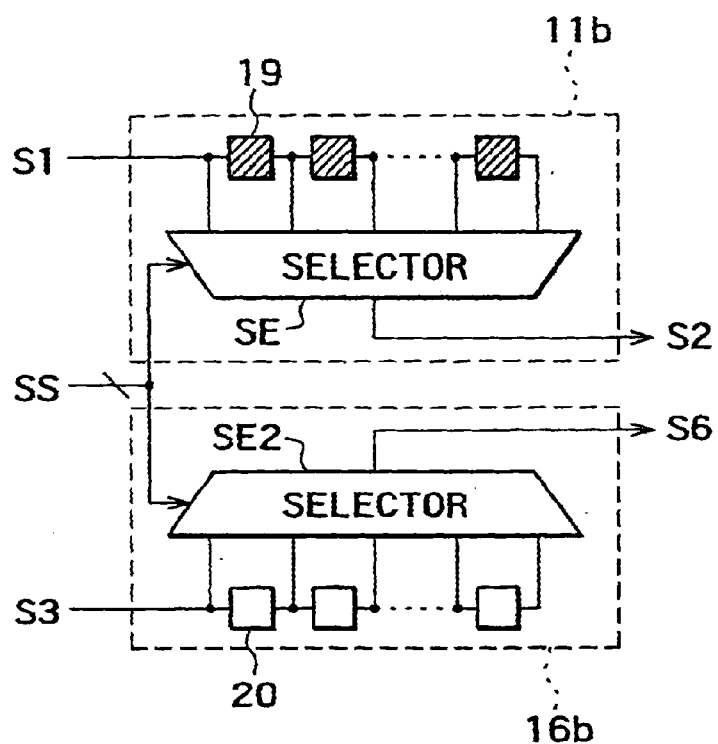
FIG. 4 is a diagram showing a configuration of a delayed signal generating circuit and a detection signal generating circuit according to a second embodiment of the present invention.

A semiconductor device according to a second embodiment of the present invention has the same configuration as the semiconductor device according to the first embodiment, except that the semiconductor device according to the second embodiment includes a delayed signal generating circuit b and a detection signal generating circuit 16b shown in FIG. 4 in place of the delayed signal generating circuit 11 and the detection signal generating circuit 16.

The delayed signal generating circuit 11b is provided with delay elements 19, and the detection signal generating circuit 16b is also provided with delay elements 20.

The semiconductor device according to the second embodiment is configured such that a difference between a delay component formed by the delay elements 19 and a delay component formed by the delay elements 20 represents a desired delay component, that is, a delay component possessed by a critical path of a target circuit 15.

Figure 5A:
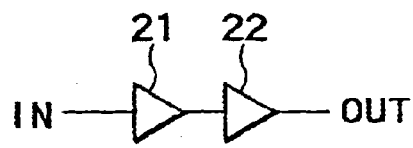
FIGS. 5A and 5B are diagrams showing a first example of configuration of gate delay elements shown in FIG. 4.
Figure 5B:
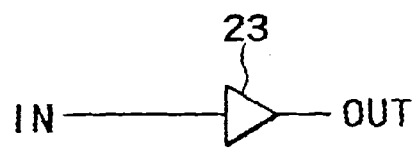

The delay elements 19 and the delay elements 20 can be formed by gate delay elements shown in FIG. 5A and FIG. 5B, respectively. Specifically, as shown in FIG. 5A, the delay element 19 is formed by two buffers 21 and 22 connected in series with each other, and as shown in FIG. 5B, the delay element 20 is formed by one buffer 23, for example.

With such a configuration, the delayed signal generating circuit 11b has a delay component greater than the detection signal generating circuit 16b by one buffer. Therefore, a gate delay component corresponding to one buffer can be reproduced as an object to be evaluated.

In addition, with the semiconductor device according to the second embodiment of the present invention, input capacity of the delayed signal generating circuit 11b is equal to that of the detection signal generating circuit 16b. Thus, it is possible to increase accuracy of a delay component generated as a whole.

Figure 6A:
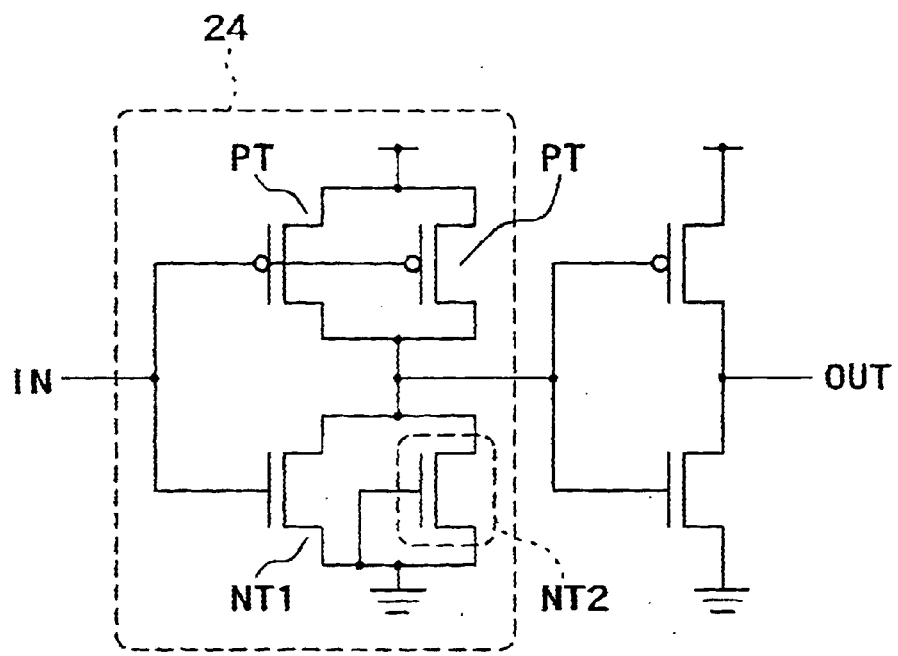
FIGS. 6A and 6B are diagrams showing a second example of configuration of gate delay elements shown in FIG. 4.
Figure 6B:
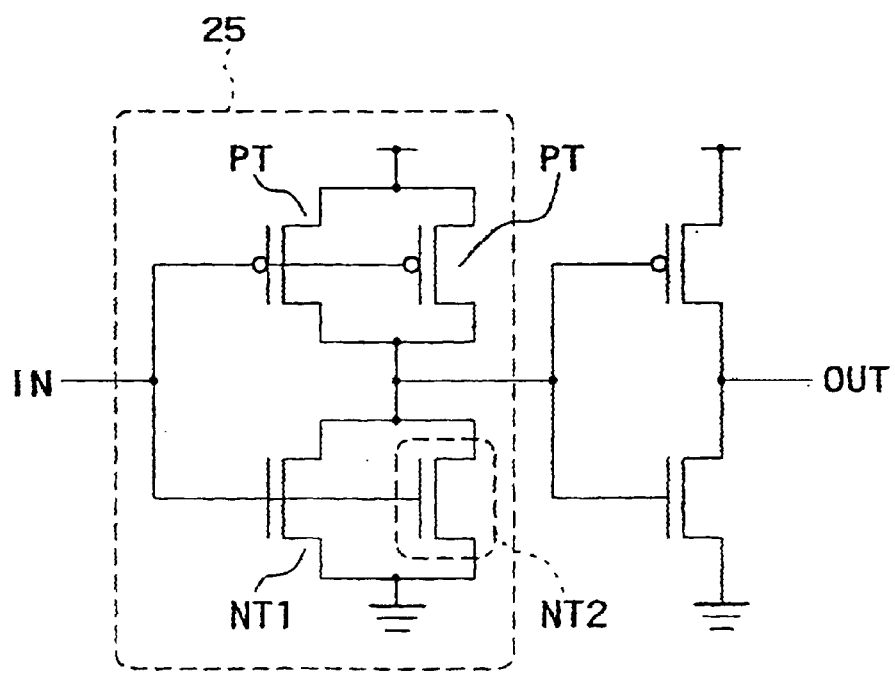

The delay element 19 and the delay element 20 shown in FIG. 4 can be formed by two-stage inverters shown in FIG. 6A and FIG. 6B, respectively. The inverter 24 and the inverter 25 are formed with the same transistor size. The inverter 24 and the inverter 25 each have P-channel MOS transistors PT connected in parallel with each other between an output node and a power supply voltage node, and each have N-channel MOS transistors NT1 and NT2 connected in parallel with each other between the output node and a ground node. A gate of the N-channel MOS transistor NT2 included in the inverter 24 is connected to the ground node, whereas a gate of the N-channel MOS transistor NT2 included in the inverter 25 is connected to the input node.

Thus, the transistor size of the N-channel MOS transistors forming the inverter 24 is ½of the transistor size of the N-channel MOS transistors forming the inverter 25. Hence, a difference in delay time between both the inverters 24 and 25 occurs in a process of the N-channel MOS transistors NT1 and NT2 discharging load capacitance, while no difference in delay occurs in a process of the P-channel MOS transistors PT charging the load capacitance.

Thus, when the delay elements 19 and 20 are formed by the inverters shown in FIGS. 6A and 6B, only a delay component resulting from the load discharge by the N-channel MOS transistors can be reproduced as an object to be evaluated.

Figure 7A:
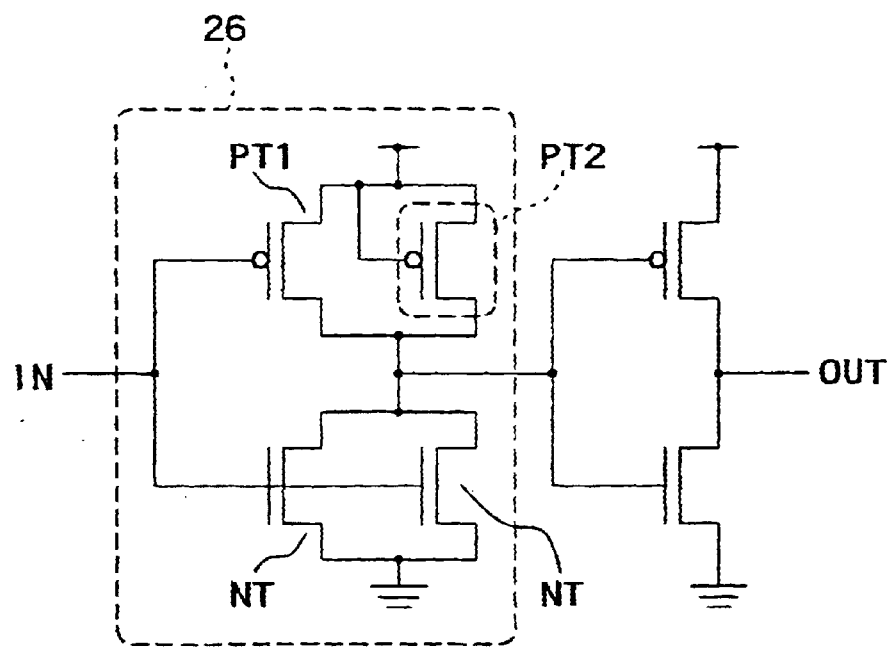
FIGS. 7A and 7B are diagrams showing a third example of configuration of gate delay elements shown in FIG. 4.
Figure 7B:
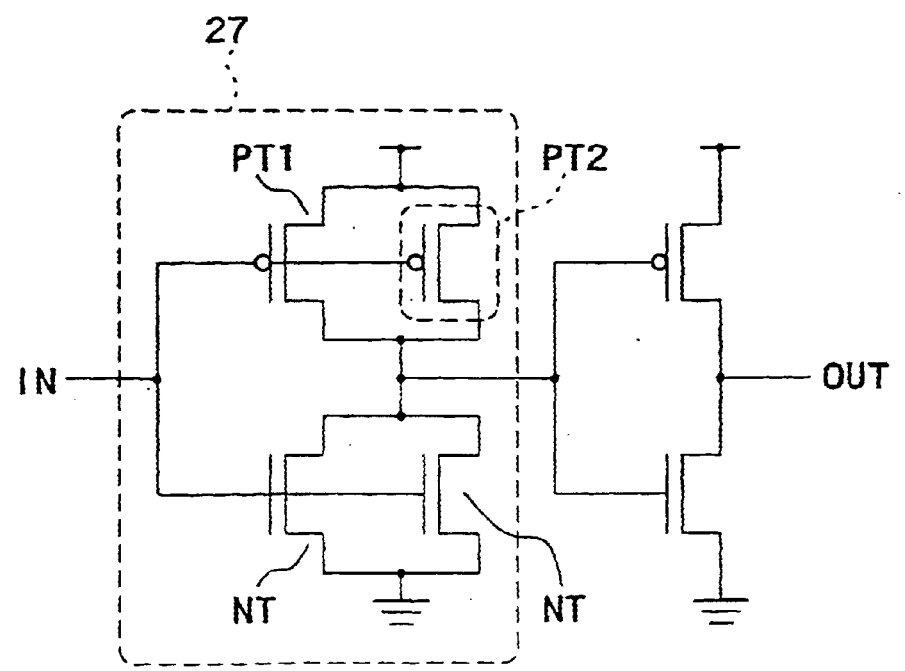

The delay element 19 and the delay element 20 shown in FIG. 4 can be formed by two-stage inverters shown in FIG. 7A and FIG. 7B, respectively. The inverter 26 and the inverter 27 are formed with the same transistor size. The inverter 26 and the inverter 27 each have P-channel MOS transistors PT1 and PT2 connected in parallel with each other between an output node and a power supply voltage node, and each have N-channel MOS transistors NT connected in parallel with each other between the output node and a ground node. A gate of the P-channel MOS transistor PT2 included in the inverter 26 is connected to the power supply voltage node, whereas a gate of the P-channel MOS transistor PT2 included in the inverter 27 is connected to the input node.

Thus, the transistor size of the P-channel MOS transistors forming the inverter 26 is ½of the transistor size of the P-channel MOS transistors forming the inverter 27. Hence, a difference in delay time between both the inverters 26 and 27 occurs in a process of load charge by the P-channel MOS transistors PT1 and PT2, while no difference in delay occurs in a process of load discharge by the N-channel MOS transistors NT.

Thus, when the delay elements 19 and 20 are formed by the inverters shown in FIGS. 7A and 7B, only a delay component resulting from the load charge by the P-channel MOS transistors can be reproduced as an object to be evaluated.

Figure 8A:
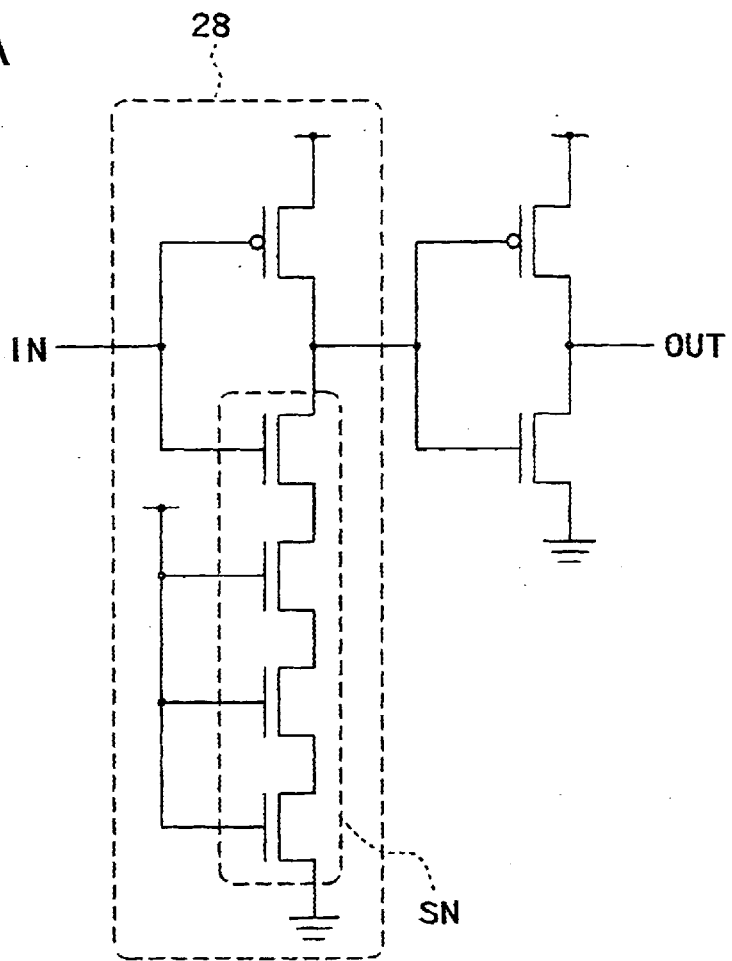
FIGS. 8A and 8B are diagrams showing a fourth example of configuration of gate delay elements shown in FIG. 4.
Figure 8B:
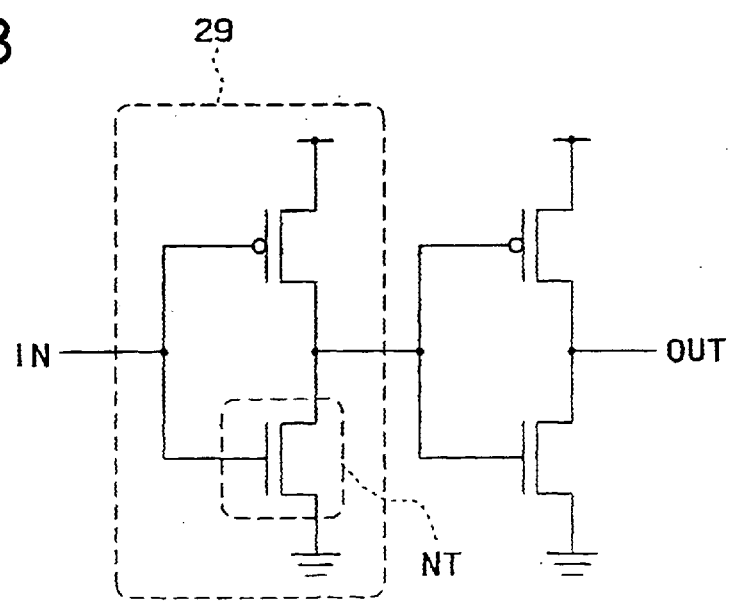

The delay element 19 and the delay element 20 shown in FIG. 4 can be formed by inverters 28 and 29 shown in FIG. 8A and FIG. 8B, respectively. The inverter 28 and the inverter 29 are formed with the same transistor size. A stacked NMOS transistor portion SN in which N-channel MOS transistors in four stages are stacked (connected in series with each other) is provided between an output node and a ground node of the inverter 28. A single N-channel MOS transistor NT is connected between an output node and a ground node of the inverter 29.

With such a configuration, duration of discharge by the inverter 28 is longer than duration of discharge by the inverter 29 by a time corresponding to a difference in number between the N-channel MOS transistors connected in series with each other and the single N-channel MOS transistor NT.

Thus, a difference occurs only in the duration of discharge between the N-channel MOS transistors of the inverters 28 and 29, and only a delay component formed by the stacked NMOS transistor portion SN can be reproduced as an object to be evaluated.

Figure 9A:
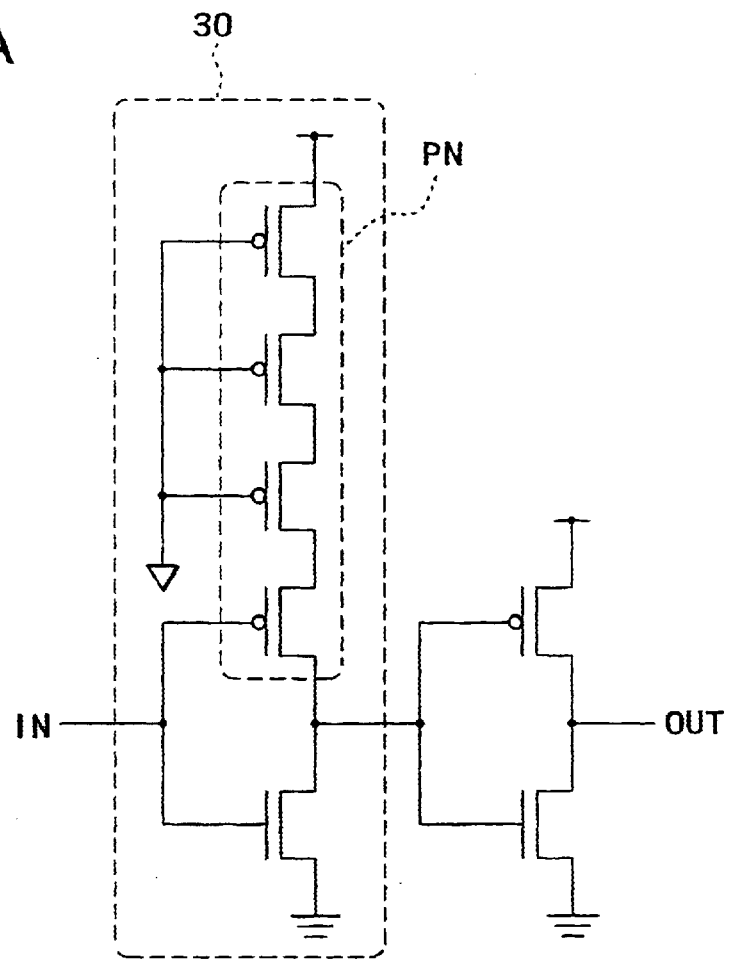
FIGS. 9A and 9B are diagrams showing a fifth example off configuration of gate delay elements shown in FIG. 4.
Figure 9B:
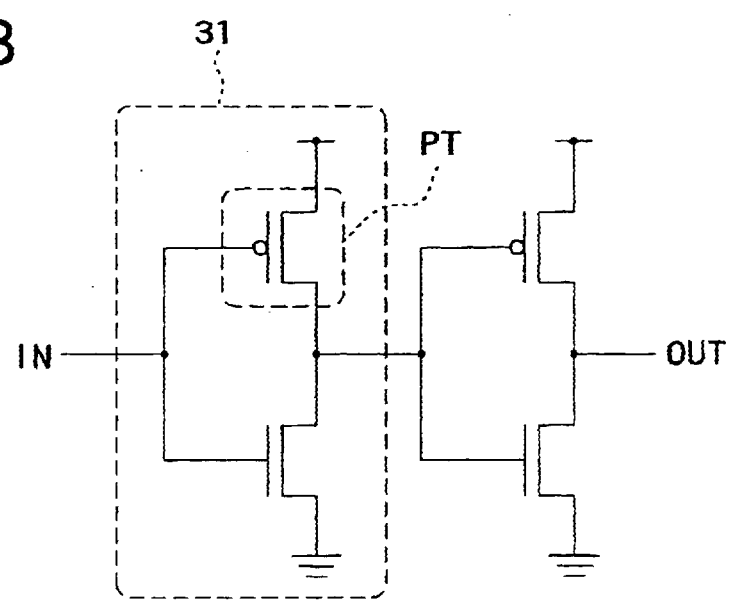

The delay element 19 and the delay element 20 shown in FIG. 4 can be formed by inverters 30 and 31 shown in FIG. 9A and FIG. 9B, respectively. The inverter 30 and the inverter 31 are formed with the same transistor size. A stacked PMOS transistor portion PN in which P-channel MOS transistors in four stages are stacked (connected in series with each other) is provided between an output node and a power supply voltage node of the inverter 30. A single P-channel MOS transistor PT is connected between an output node and a power supply voltage node of the inverter 31.

With such a configuration, duration of charge by the inverter 30 is longer than duration of charge by the inverter 31 by a time corresponding to a difference in number between the P-channel MOS transistors connected in series with each other and the single P-channel MOS transistor PT.

Thus, a difference occurs only in the duration of charge between the P-channel MOS transistors of the inverters 30 and 31, and only a delay component formed by the stacked PMOS transistor portion PN can be reproduced as an object to be evaluated.

In addition, the delay element 19 and the delay element 20 shown in FIG. 4 can be formed by an inverter formed by a transistor having a long gate length and an inverter formed by a transistor having a minimum gate length, respectively.

With such a configuration, only a delay component of the gate element using the transistor with the long gate length can be reproduced as an object to be evaluated.

Figure 10A:
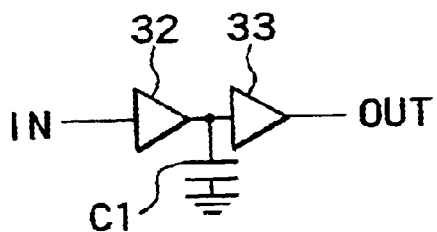
FIGS. 10A and 10B are diagrams showing a sixth example of configuration of gate delay elements shown in FIG. 4.
Figure 10B:
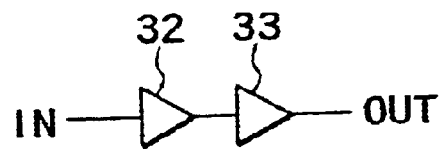

Furthermore, the delay element 19 and the delay element 20 shown in FIG. 4 can be formed by gate delay elements shown in FIG. 10A and FIG. 10B, respectively. As shown in FIGS. 10A and 10B, the delay elements 19 and 20 each have buffers 32 and 33 connected in series with each other, but the delay elements 19 and 20 are different from each other in that a capacitance C1 is connected to an output node of the buffer 32 shown in FIG. 1A.

With such a configuration, in evaluating a delay component when a large load capacitance is driven, the object to be evaluated can be a delay component formed only by the capacitance C1 connected to the buffer 32.

Figure 11A:
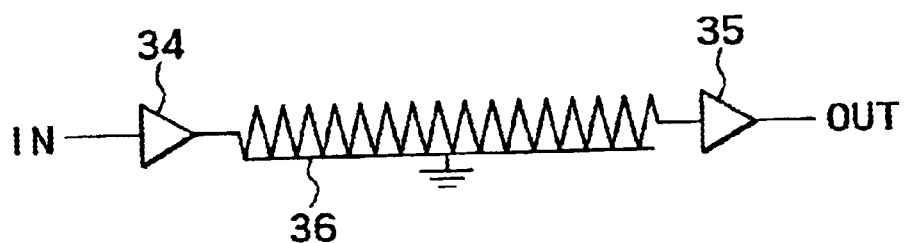
FIGS. 11A and 11B are diagrams showing a seventh example of configuration of gate delay elements shown in FIG. 4.
Figure 11B:
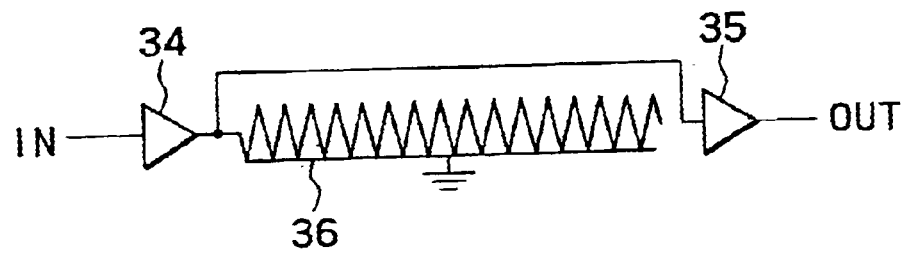

Furthermore, the delay element 19 and the delay element 20 shown in FIG. 4 can be formed by a driver 34, a receiver 35, and a wiring 36 shown in FIG. 11A and FIG. 11B, respectively. In this case, the wirings 36 shown in FIG. 11A and FIG. 11B are of the same length, and both the drivers 34 for driving the wirings 36 are of the same size. Both the receivers 35 shown in FIG. 11A and FIG. 11B are also of the same size.

In the delay element of the delayed signal generating circuit shown in FIG. 11A, an input node of the receiver 35 is connected to an end point of the wiring 36. In the delay element of the detection signal generating circuit shown in FIG. 11B, an input node of the receiver 35 is connected to a start point of the wiring 36.

With such a configuration, it is possible to suppress a delay error resulting from a difference of a load formed by an output resistance of the driver 34 and the wiring 36, and thereby increase accuracy of the reproduced wiring delay component.

Incidentally, in the delay element shown in FIG. 11B, the input node of the receiver 35 is connected to the start point of the wiring 36; however, the input node of the receiver 35 may be connected to a midpoint of the wiring 36.

Figure 12:
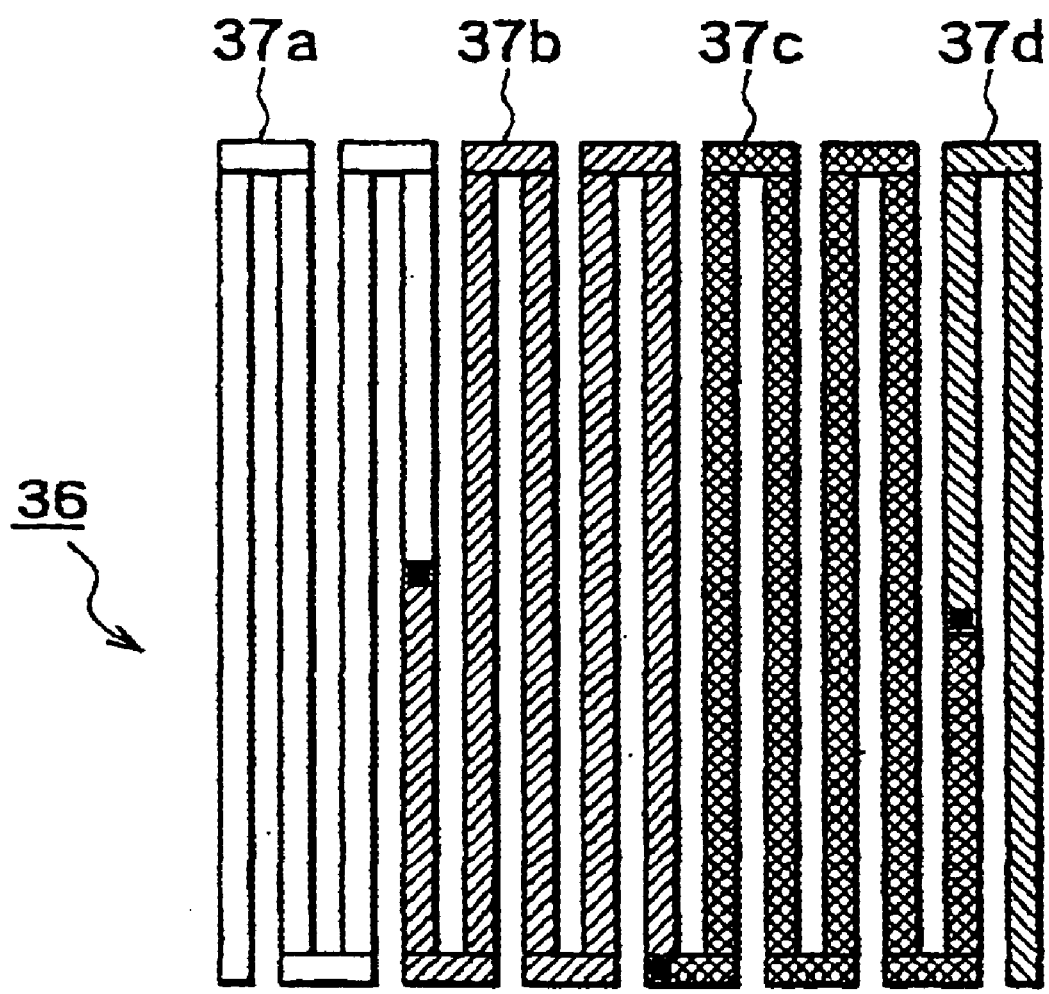
FIG. 12 is a plan view of assistance in explaining structure of a wiring delay element shown in FIGS. 11A and 11B.

A semiconductor integrated circuit generally uses a plurality of wiring layers. Process variations may differ between the wiring layers. Thus, in order to deal with such process variations, it is desirable to form the wiring 36 by mixing the plurality of wiring layers. Specifically, as shown for example in FIG. 12, the wiring 36 has a structure in which a wiring layer 37a formed in a first layer, a wiring layer 37b formed in a second layer, a wiring layer 37c formed in a third layer, and a wiring layer 37d formed in a fourth layer are sequentially connected to each other. In this case, such a plurality of wiring layers have a mixture ratio corresponding to a ratio of wiring layers used by the target circuit 15.

As described above, the semiconductor device according to the second embodiment of the present invention can reproduce a more accurate delay component as a difference between the delay characteristics of the delay elements 19 and 20.

Third Embodiment

Figure 13:
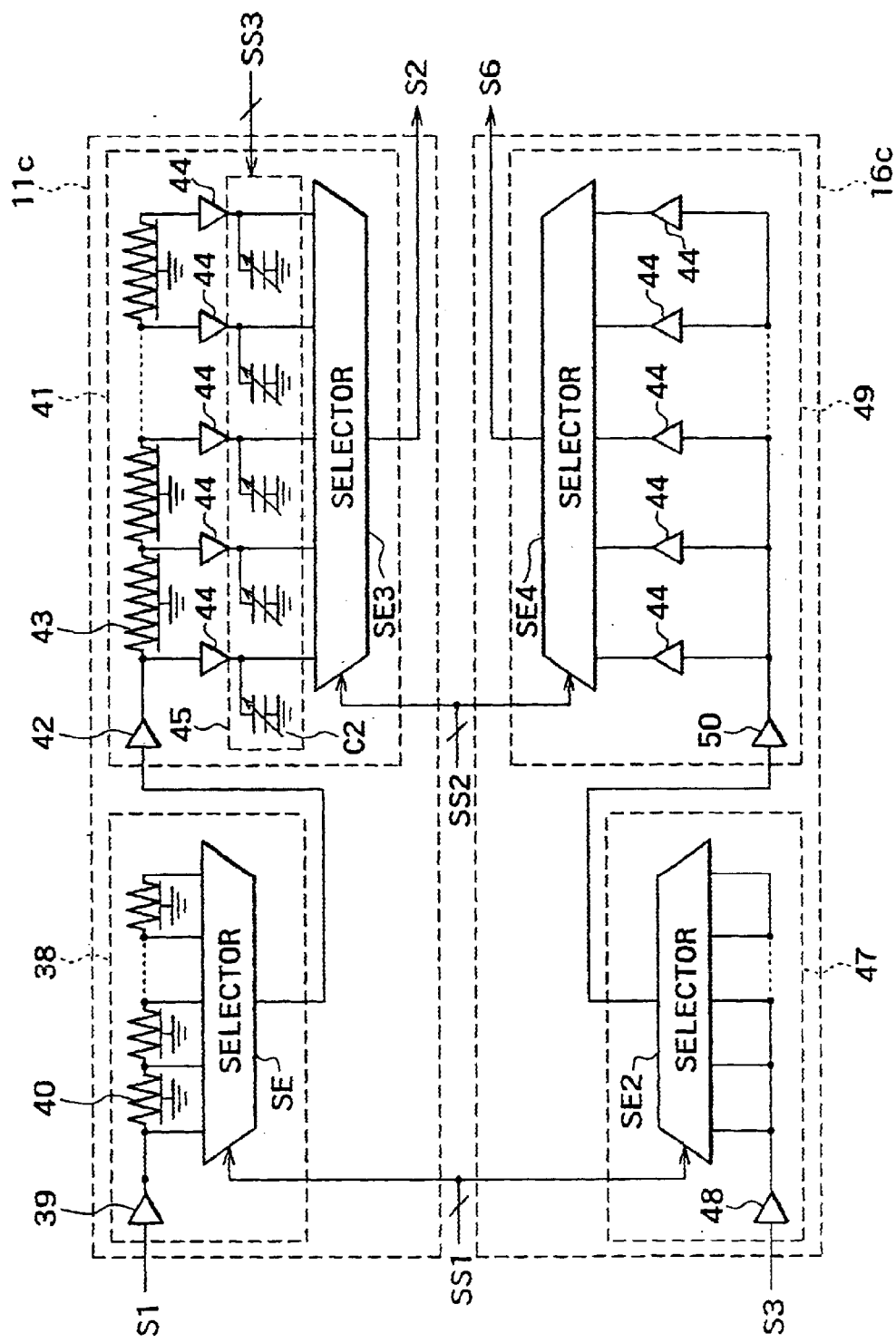
FIG. 13 is a diagram showing a configuration of a semiconductor device according to a third embodiment of the present invention.

A semiconductor device according to a third embodiment of the present invention has the same configuration as the semiconductor device according to the first embodiment, except that the semiconductor device according to the third embodiment includes a delayed signal generating circuit 11c and a detection signal generating circuit 16c shown in FIG. 13 in place of the delayed signal generating circuit 11 and the detection signal generating circuit 16.

As shown in FIG. 13, the delayed signal generating circuit 11c according to the third embodiment includes delayed signal generating units 38 and 41 connected in series with each other, and the detection signal generating circuit 16c includes detection signal generating units 47 and 49 connected in series with each other. The delayed signal generating unit 38 includes a buffer 39, a plurality of wiring delay elements 40 connected in series with each other, and a selector SE. The delayed signal generating unit 41 includes a buffer 42, a plurality of wiring delay elements 43 connected in series with each other, a plurality of buffers 44 connected in parallel with each other at intermediate nodes between the wiring delay elements 43, a load adjusting unit 45 formed by a plurality of variable capacitances C2 connected to output nodes of the buffers 44, and a selector SE3. An output node of the selector SE is connected to the buffer 42.

The detection signal generating unit 47 includes a buffer 48 and a selector SE2. The detection signal generating unit 49 includes a buffer 50, buffers 44 connected in parallel with each other, and a selector SE4. An output node of the selector SE2 is connected to the buffer 50.

In the semiconductor device described above, the selectors SE and SE2 are supplied with a setting signal SS1 from a register 8 included in a target circuit 15 or an external pin (not shown). Similarly, the selectors SE3 and SE4 are supplied with a setting signal SS2 from the register 8 or the external pin. The buffer 39 is supplied with a reference pulse signal S1, and the buffer 48 is supplied with a detection pulse signal S3. The selector SE3 outputs a delayed pulse signal S2, and the selector SE4 outputs a detection pulse signal S6.

The semiconductor device according to the third embodiment as described above reproduces delay characteristics of a transmission path in which a receiver that receives a signal having a waveform blunted as a result of propagation through a long wire, for example, has a load capacitance. Generally, in such a transmission path, the proportions of wiring delay and receiver delay in one cycle are very high, and such delay components govern transmission characteristics of the entire path in many cases. Accordingly, in such particular cases, the semiconductor device according to the third embodiment adjusts the wiring delay component and the load capacitance of the receiver simultaneously.

Specifically, in order that the delayed signal generating unit 38 can finely adjust the wiring delay, the wiring delay elements 40 are formed by short wirings. On the other hand, the delayed signal generating unit 41 is formed with long wiring so that the delayed signal generating unit 41 can make only rough adjustment of the wiring delay. The variable capacitances C2 are set to an arbitrary capacitance in response to a load capacitance setting signal SS3 supplied from the register 8 or the external pin (not shown).

Thus, the semiconductor device according to the third embodiment of the present invention can roughly adjust the wiring delay by arbitrarily setting the selector SE3 using the setting signal SS2, and more finely adjust the wiring delay on a hierarchical basis by arbitrarily setting the selector SE using the setting signal SS1. In addition, the semiconductor device according to the third embodiment of the present invention can simultaneously adjust the load capacitance by controlling the load adjusting unit 45 using the setting signal SS3.

Thus, the semiconductor device according to the third embodiment has a high-precision delay adjusting function, while circuit area of the semiconductor device is minimized.

Fourth Embodiment

Figure 14:
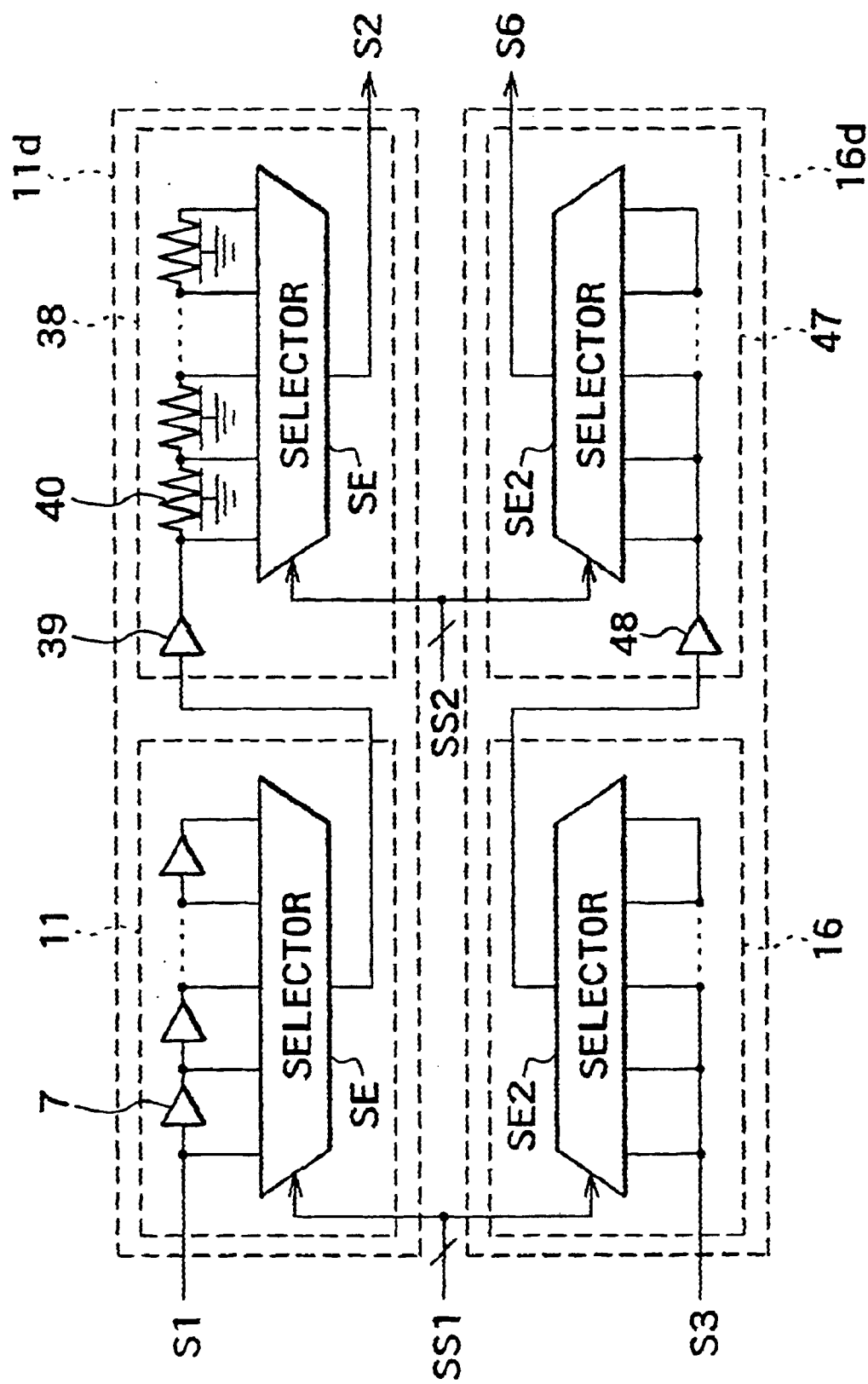
FIG. 14 is a diagram showing a configuration of a semiconductor device according to a fourth embodiment of the present invention.
Figure 15:
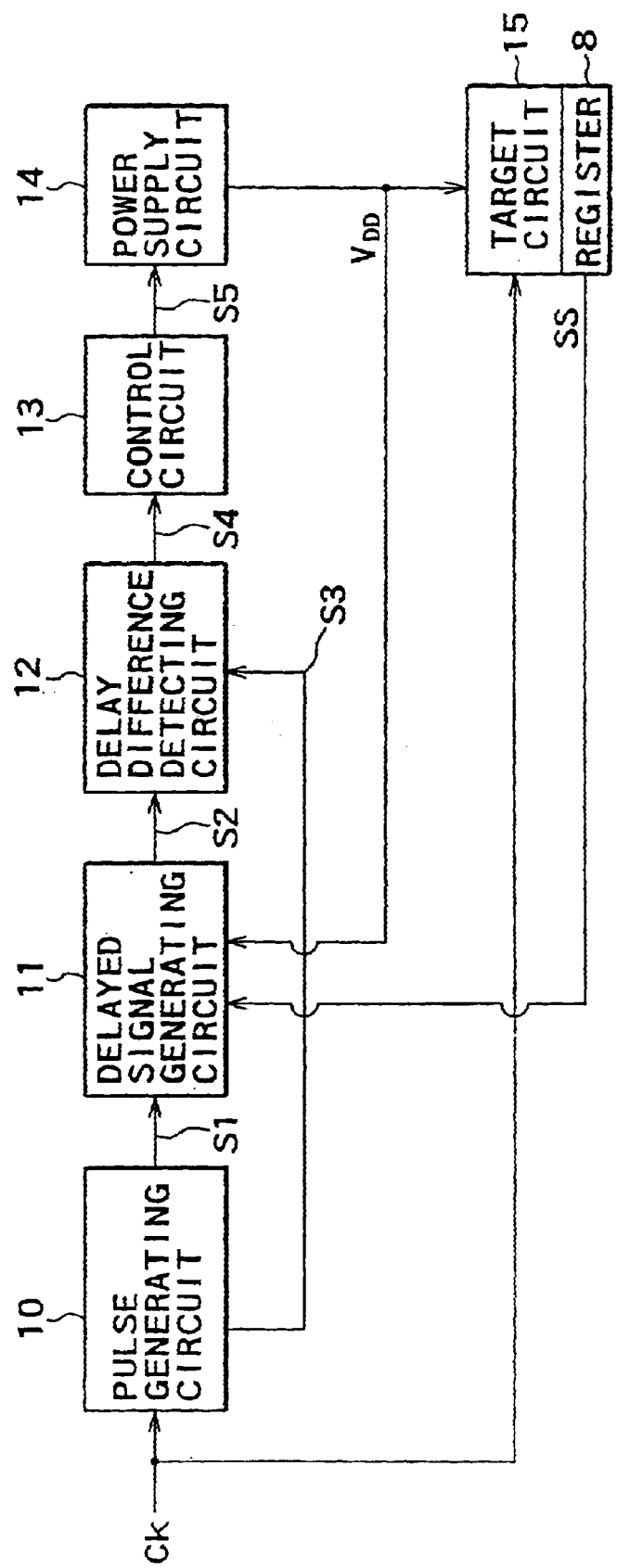
FIG. 15 is a block diagram showing a configuration of a conventional semiconductor device.

A semiconductor device according to a fourth embodiment of the present invention has the same configuration as the semiconductor device according to the first embodiment, except that the semiconductor device according to the fourth embodiment includes a delayed signal generating circuit 11d and a detection signal generating circuit 16d shown in FIG. 14 in place of the delayed signal generating circuit 11 and the detection signal generating circuit 16. The delayed signal generating circuit 11d and the detection signal generating circuit 16d according to the fourth embodiment have a similar configuration as that of the delayed signal generating circuit 11c and the detection signal generating circuit 16c according to the third embodiment, but delay components to be adjusted by the delayed signal generating circuit 11d and the detection signal generating circuit 16d according to the fourth embodiment are different from those of the delayed signal generating circuit 11c and the detection signal generating circuit 16c according to the third embodiment. The semiconductor device according to the fourth embodiment will be specifically described in the following.

As shown in FIG. 14, the delayed signal generating circuit 11d according to the fourth embodiment includes a delayed signal generating circuit 11 and a delayed signal generating unit 38 connected in series with each other, and the detection signal generating circuit 16d includes a detection signal generating circuit 16 and a detection signal generating unit 47 connected in series with each other. An output node of a selector SE is connected to a buffer 39. An output node of a selector SE2 is connected to a buffer 48.

The semiconductor device according to the fourth embodiment having such a configuration adjusts a gate delay component and a wiring delay component simultaneously.

Specifically, the semiconductor device according to the fourth embodiment can adjust the gate delay component by arbitrarily setting the selectors SE and SE2 using a setting signal SS1, and adjust the wiring delay component by arbitrarily setting selectors SE and SE2 using a setting signal SS2.

Thus, the semiconductor device according to the fourth embodiment can reproduce delay components of a target circuit 15 having the delay components of different characteristics.

It is to be noted that while the semiconductor device according to the fourth embodiment of the present invention has, as delay elements, buffers 7 in the delayed signal generating circuit 11 and wiring delay elements 40 in the delayed signal generating unit 38, the various delay elements shown in FIGS. 5A and 5B to FIGS. 11A and 11B can be used arbitrarily in combination in place of the buffers 7 and the wiring delay elements 40.

Furthermore, when a plurality of delayed signal generating circuits or delayed signal generating units having different delay components as described above are connected in series with each other, more complex delay characteristics of the target circuit 15 can be reproduced, so that accuracy and versatility in adjusting power supply voltage to the target circuit 15 can be further increased.

The semiconductor device according to the present invention cancels out a delay time caused by the delay amount selecting means itself included in the delay means by the reference signal generating means, and can thus reproduce a delay component equal to the delay component of the internal circuit with high accuracy. Therefore, it is possible to improve accuracy in adjustment of the power supply voltage by the power supply voltage adjusting means. It is thus possible to control the power supply voltage supplied to the internal circuit with high accuracy, to thereby reduce power consumption of the semiconductor device.

What is claimed is:

1. A semiconductor device including an internal circuit, said semiconductor device comprising:

delay means for delaying an input signal by a delay time caused by a delay component on a critical path of said internal circuit by delay-amount-selecting means included in the delay means and, thereby, generating a delayed signal;

reference-signal-generating means, having a delay component identical with a delay component of said delay-amount-selecting means, for generating a reference signal delayed in phase by one cycle of an internal operating-clock signal in comparison with said input signal;

phase-difference-detecting means for detecting a phase difference between said reference signal and said delayed signal; and power-supply voltage adjusting means for adjusting the magnitude of a power-supply voltage supplied to said internal circuit according to said phase difference detected by said phase-difference-detecting means.

2. A semiconductor device as claimed in claim 1, wherein said delay means delays said input signal by any one of a gate, a wiring, a capacitor, and a MOS transistor.

3. A semiconductor device as claimed in claim 2, wherein said wiring is formed by connecting a plurality of wiring layers forming said internal circuit according to the component ratio of said plurality of wiring layers.

4. A semiconductor device as claimed in claim 1, wherein a difference between the delay components of said delay means and said reference-signal-generating means is the delay component of an element forming the critical path of said internal circuit.

5. A semiconductor device including an internal circuit, said semiconductor device comprising:

first delay means for delaying an input signal by a first delay time caused by a first delay component on a critical path of said internal circuit by said first delay component with first delay-amount-selecting means included in the first delay means, and, thereby, generating a first delayed signal;

second delay means for delaying said first delayed signal by a second delay time caused by a second delay component on the critical path of said internal circuit by said second delay component with second delay-amount-selecting means included in the second delay means and, thereby, generating a second delayed signal;

reference signal generating means, having a delay component identical with delay components of said first delay-amount-selecting means and said second delay-amount-selecting means, for generating a reference signal delayed in phase by one cycle of an internal operating-clock signal in comparison with said input signal;

phase-difference-detecting means for detecting a phase difference between said reference signal and said second delayed signal; and power-supply-voltage-adjusting means for adjusting the magnitude of a power-supply voltage supplied to said internal circuit according to said phase difference detected by said phase-difference-detecting means.

6. A semiconductor device as claimed in claim 5, wherein said first delay component is a delay component of a wiring having a first length and said second delay component is a delay component of a wiring having a second length longer than said first length.

7. A semiconductor device as claimed in claim 6, wherein said second delay component further includes a delay component of a variable capacitor.

8. A semiconductor device as claimed in claim 5, wherein said first delay component is a delay component of a gate and said second delay component is a delay component of wiring.

* * * * *